United States Patent [19]

Decker

[11] 4,141,021
[45] Feb. 20, 1979

[54] FIELD EFFECT TRANSISTOR HAVING SOURCE AND GATE ELECTRODES ON OPPOSITE FACES OF ACTIVE LAYER

[75] Inventor: David R. Decker, Charlottsville, Va.

[73] Assignee: Varian Associates, Inc., Palo Alto, Calif.

[21] Appl. No.: 768,522

[22] Filed: Feb. 14, 1977

[51] Int. Cl.$^2$ ............................................. H01L 29/80
[52] U.S. Cl. .......................................... 357/22; 357/4; 357/23; 357/52; 357/55; 357/81
[58] Field of Search .................... 357/4, 22, 23, 81, 52, 357/55

[56] References Cited
U.S. PATENT DOCUMENTS

| | | | |
|---|---|---|---|
| 3,813,585 | 5/1974 | Tarui et al. | 357/22 |
| 3,818,426 | 6/1974 | Bonnet et al. | 357/4 |
| 3,986,196 | 10/1976 | Decker | 357/81 |
| 4,015,278 | 3/1977 | Fukuta | 357/22 |

Primary Examiner—Edward J. Wojciechowicz
Attorney, Agent, or Firm—Stanley Z. Cole; Robert K. Stoddard; Gerald M. Fisher

[57] ABSTRACT

By positioning the source and gate electrodes on the opposite faces of the active layer, these electrodes can be brought closer together and may have their adjacent edges mutually aligned or even overlapping. The series source resistance and channel resistance can be greatly reduced, because of this closer spacing, which can not be attained when the electrodes are coplanar. By also locating the drain electrode on the same side of the active layer as the source, the source-to-drain spacing can be significantly reduced, reducing channel length and improving the high frequency performance of the transistor. Further, because the electrodes are located on both sides of the active layer, it is possible to provide a large area contact on the bottom, or substrate, side of the epitaxial wafer structure which can advantageously be used to provide a low thermal and electrical resistance connection for the source contact, for example. Finally, the fact that one or more of the electrodes can be contacted from the bottom of the wafer makes possible the simple parallel interconnection of electrodes to easily form multiple element power transistors.

6 Claims, 8 Drawing Figures

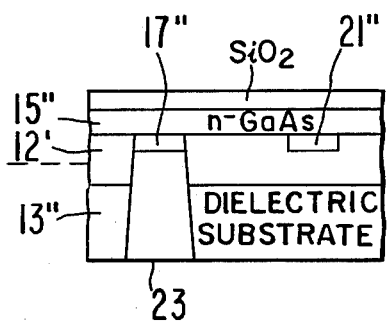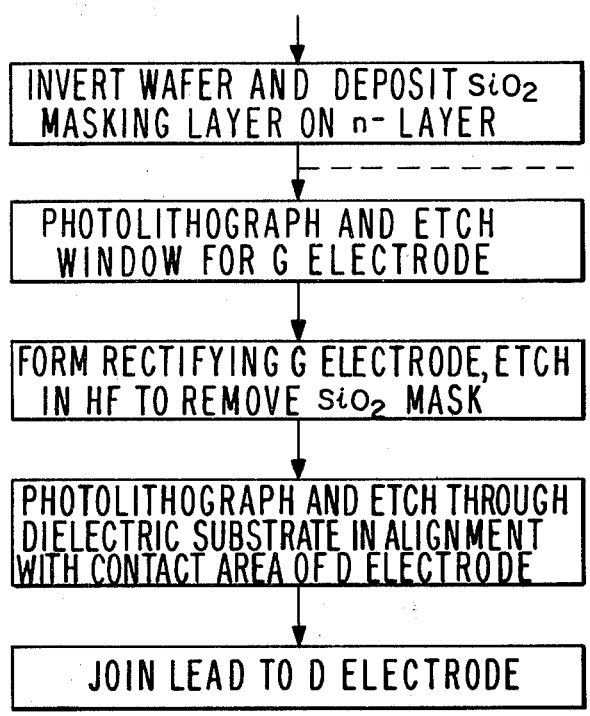
FIG. 6B
FIG. 7
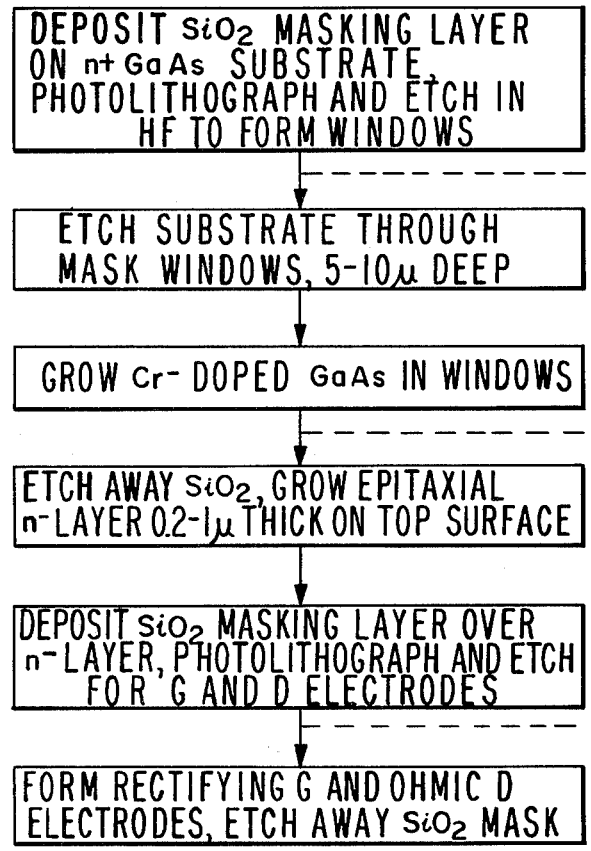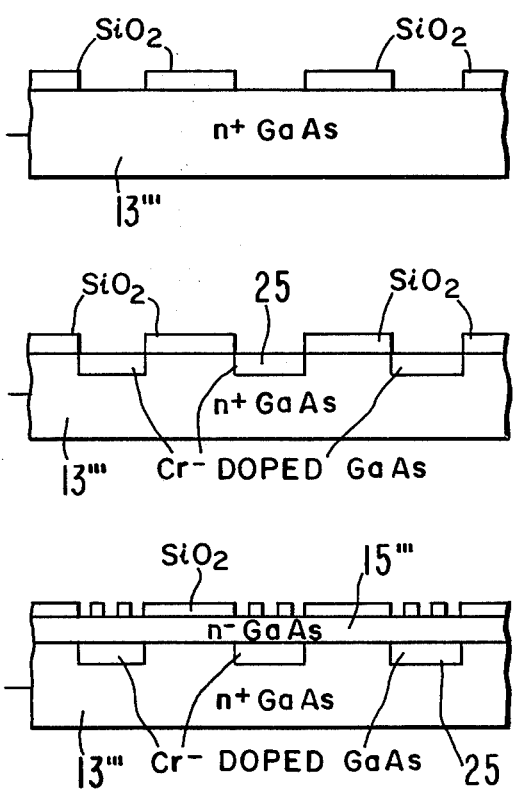

FIELD EFFECT TRANSISTOR HAVING SOURCE AND GATE ELECTRODES ON OPPOSITE FACES OF ACTIVE LAYER

BACKGROUND OF THE INVENTION

This invention was made in the course of or under a contract or subcontract thereunder with the Office of Naval Research.

Field-effect transistors have been known for some time in which the transistor was formed by producing source, gate, and drain electrodes on the face of a thin active layer supported on an insulative substrate. While these prior art field-effect transistors (FET's) have had satisfactory performance in a variety of applications, their high frequency and high power application has been somewhat limited by the physical dimensions of the device, occasioned by the necessity to provide adequate spacing between the three electrodes, resulting in a certain minimum channel length from source to drain. The physical dimensions of the device establish an upper cutoff frequency through transit time and capacitance effects, while channel resistance limits the power handling capability of the device.

SUMMARY OF THE INVENTION

The present invention reduces the long, highly resistive channel and lowers transit time and capacitance by positioning the gate electrode on the opposite side of the active layer from the source electrode. When this has been done, it is possible to position the gate and source electrodes much closer together than was possible in the prior art. For example, the gate and source electrodes may be partially overlapping on the active layer or at least may be positioned such that their adjacent edges are aligned. When this has been done, as can readily be appreciated, the distance from the gate to the source is substantially reduced as compared with the situation which is possible when these two electrodes are mounted on the same face of the active layer, (i.e. co-planar). The channel length from source to drain is also reduced. Thus, the high frequency performance and channel resistance are both improved.

It is a principal object of the invention to provide an FET having improved high frequency performance.

It is an additional object of the present invention to provide an FET having a reduced channel resistance.

It is a further object of the present invention to provide an FET in which the gate and source electrodes are mounted on opposite faces of the active layer.

It is a further object of the present invention to provide an FET in which the adjacent edges of the gate and source electrodes are aligned.

These and other features, objects and advantages of the present invention will become clear from reading the following detailed description of a preferred embodiment and studying the drawings.

BRIEF DESCRIPTION OF THE DRAWINGS

FIG. 6A, and FIG. 6B, which is a continuation of FIG. 6A, together comprise a mixed process-and-product drawing including sectional side views of several intermediate products in the fabrication of an FET similar to that of FIG. 3.

FIG. 7 is a mixed process-and-product drawing including sectional side views of several intermediate products in the fabrication of an FET similar to the one shown in FIG. 4.

DESCRIPTION OF THE PREFERRED EMBODIMENT

Figure 1:
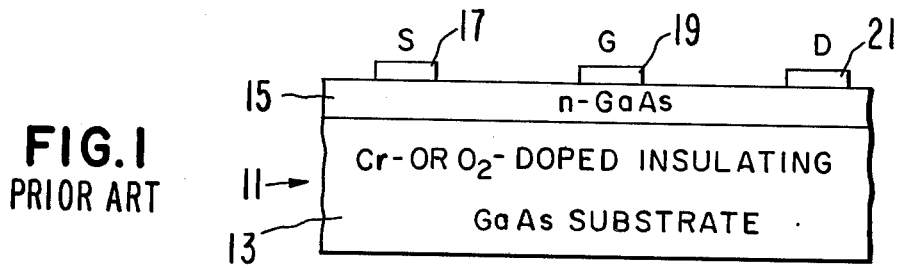
FIG. 1 is a sectional side view of a prior art planar FET.

FIG. 1 illustrates a prior art planar FET 11 having a chromium-doped or oxygen-doped relatively insulating GaAs substrate 13 upon which is epitaxially grown a thin active layer 15 of N-doped GaAs, for example. By well known processes such as the formation by photolithography and subsequent etching of a silicon dioxide mask, source 17, gate 19 and drain 21 electrodes are formed on the surface of the active layer 15. Source 17 and drain 21 are ohmic contacts and Gate 19 is a Schottky barrier (rectifying) contact as is well known.

Figure 2:
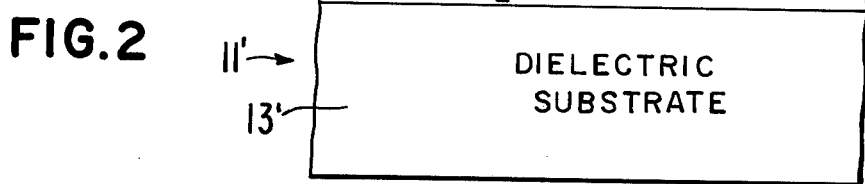
FIG. 2 is a sectional side view of a non-coplanar FET according to the present invention.

FIG. 2 illustrates a preferred embodiment of the present invention in which the FET 11' consists of a chromium-doped or oxygen-doped relatively insulating gallium arsenide substrate 12, a thin (0.2 to 1 micron, for example) active layer of epitaxial n-type GaAs 15' and a supporting dielectric substrate 13' which might be, for example, a transparent borosilicate glass. However, in accordance with the present invention, source electrode 17' and gate electrode 19' are no longer coplanar as in the prior art. In particular, source electrode 17' is located on the underside of active layer 15' whereas gate electrode 19' remains on the top surface thereof. Drain electrode 21' has also been illustrated on the undersurface of active layer 15' but could be located on the same (top) surface as gate 19'.

Figure 3:
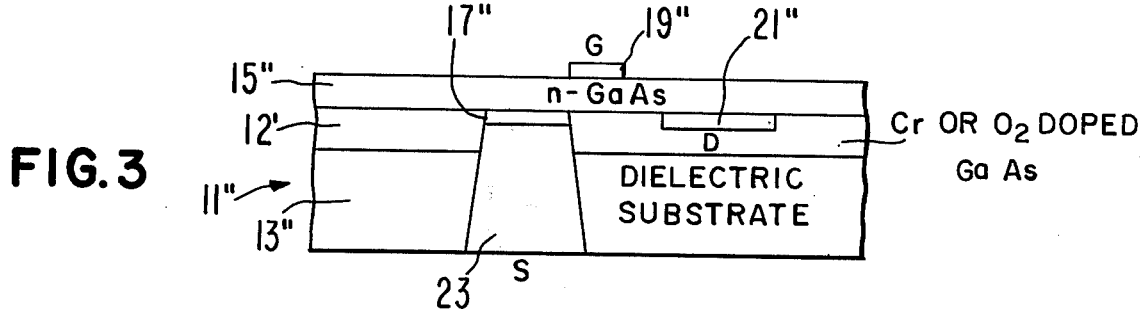
FIG. 3 is a sectional side view of an FET having a source contact extending through the substrate according to the present invention.

FIG. 3 illustrates an FET 11" of the same general type as illustrated in FIG. 2 having a chromium- or oxygen-doped relatively insulating gallium arsenide substrate 12', a thin (0.2-1 micron for example) active layer of epitaxial n-type GaAs 15" and a supporting dielectric substrate 13" which might be for example, a transparent borosilicate glass. Source 17", gate 19", and drain 21" are arranged on active layer 15" as in FIG. 2. However in accordance with another aspect of the invention a large thermally and electrically conductive contact 23 extends from source electrode 17" through gallium arsenide substrate 12' and dielectric substrate 13". Conductive contact 23 has its upper surface in contact with source electrode 17", and may be fully coextensive with source 17".

Figure 4:
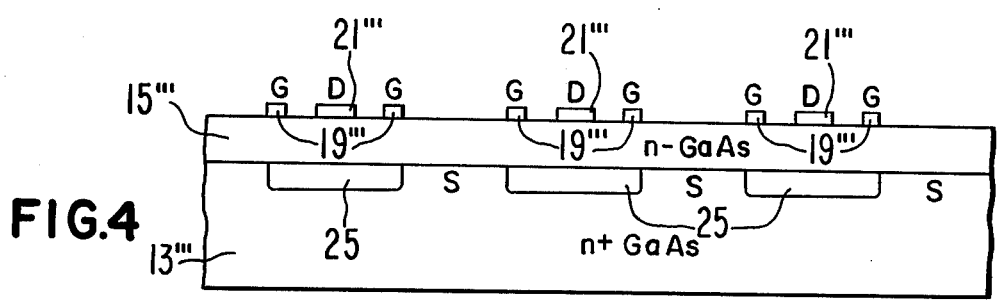
FIG. 4 is a sectional side view of a plural-element FET with a common source electrode according to the present invention.

FIG. 4 illustrates an embodiment of the present invention in which a substrate of n+ GaAs 13''' serves also as a source electrode for the FET. Substrate 13''' has large area and high thermal and electrical conductivity. As illustrated the FET of FIG. 4 is a multi-element structure having a common source electrode and plural discrete gate and drain electrodes 19''' and 21''' respectively.

As already noted, substrate 13''' made of n+ GaAs serves as a common source electrode for all of the gates and drains 19''' and 21'''. Since substrate 13''' is in close contact over its entire surface with the active layer 15''' of the device, it is necessary to provide that those surface portions of substrate 13''' which are directly opposite the gates and drains 19''' and 21''' be rendered relatively insulative in order for the device to function as an FET.

Accordingly relatively insulative surface portions 25 are provided on the surface of substrate 13''' directly opposite each of the gate and drain electrodes. Although, in FIG. 4, insulative surface portions 25 have been shown as having a considerable depth, it is only necessary that a very thin surface portion of substrate 13''' be rendered insulative in order for the device to function satisfactorily. The actual depth or thickness of insulative portions 25 will vary according to the method of fabricating them as will appear infra.

Figure 5:
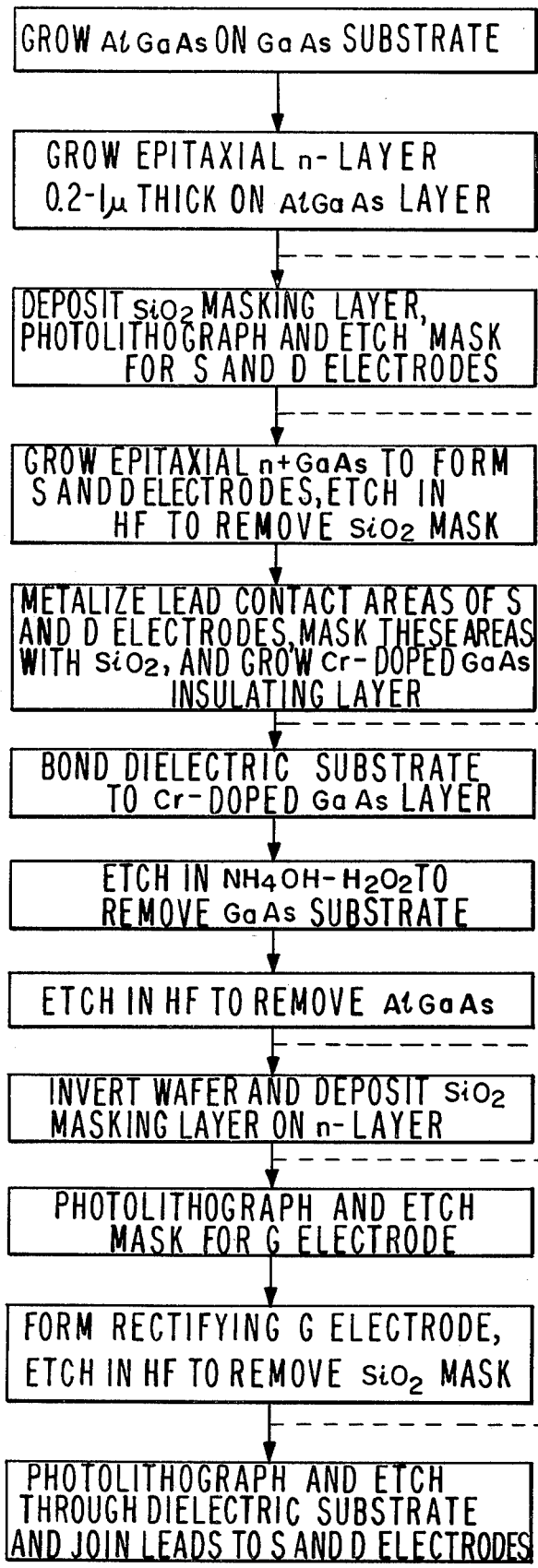
FIG. 5 is a mixed process- and-product drawing including sectional side views of several intermediate products at various stages in the fabrication of a device similar to FIG. 2.
Figure 5:
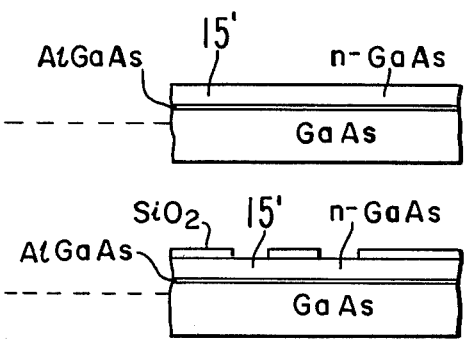
Figure 5:
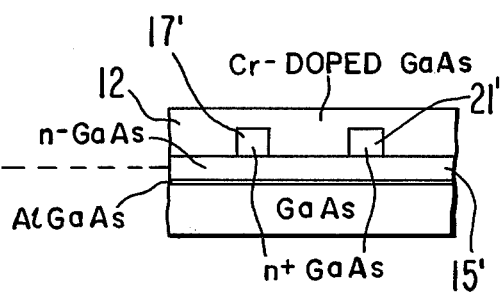
Figure 5:
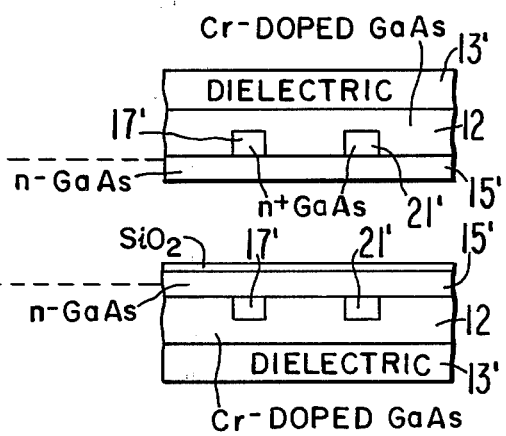
Figure 5:
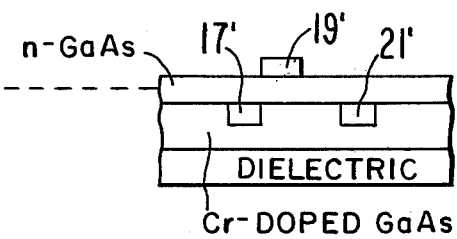
Figure 6A:
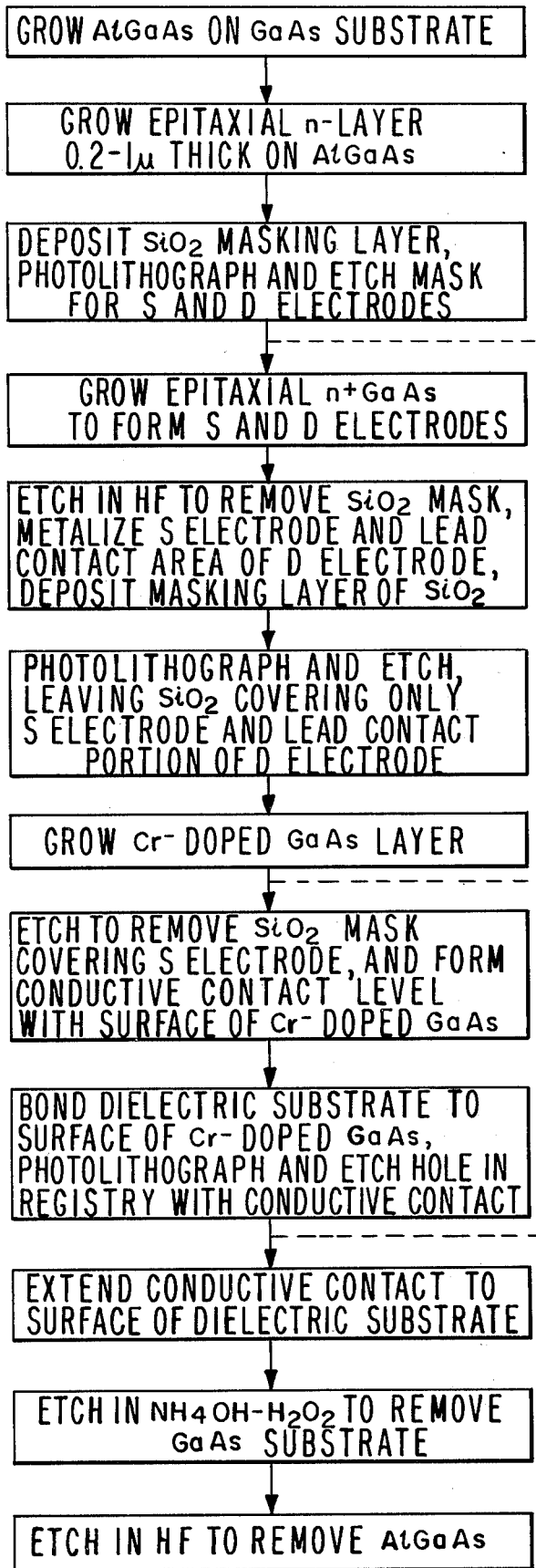
Figure 6A:
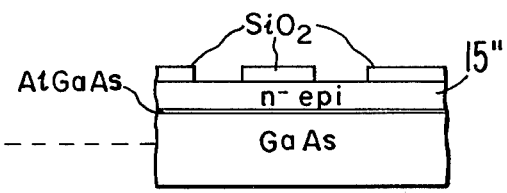
Figure 6A:
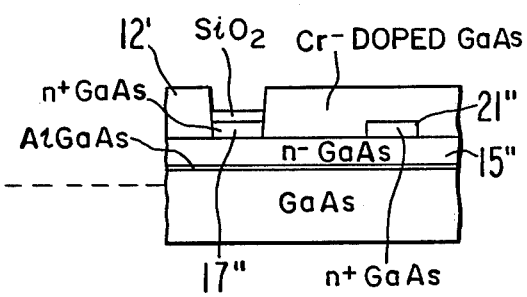
Figure 6A:
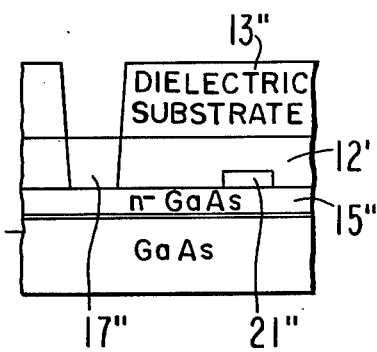

FIG. 5 details the steps in a process which could be used to form the FET of FIG. 2. The operations illustrated in the method of FIG. 5 are not the only way to form FET's of the type shown in FIG. 2, but will result in the realization of that structure using a sequence of operations which are in themselves within the skill of competent semiconductor fabrication technologists. In order to aid in understanding the process a series of intermediate products are shown in alignment with the stage of the process where they occur. Dotted lines connecting the process flow line to the intermediate products show exactly where the product occurs.

In FIG. 5 an AlGaAs layer is epitaxially grown on the surface of a GaAs substrate, followed by an n- GaAs layer approximately 0.2 - 1 micron thick which will form the active layer 15' for the device. An Si-O₂ masking layer is deposited, photolithographed and etched to form the mask for growing the S and D electrodes. These electrodes are then grown from epitaxial n+ GaAs and the SiO₂ mask is etched away in HF etchant.

A small lead contact area (not shown) on each S and D electrode is metallized for later attachment of a lead wire. These contact areas are then masked with SiO₂, and insulating layer 12 of chromium- or oxygen-doped GaAs is grown over active layer 15' and the unmasked areas of source electrode 17' and drain electrode 21'. A dielectric substrate which could be for example a borosilicate glass is bonded to the surface of the chromium-doped gallium arsenide layer.

After suitably masking the edges of the wafer, the gallium arsenide substrate is removed with an NH₄OH - H₂O₂ etchant, followed by removal of the AlGaAs layer in a buffered HF etchant. The wafer is then inverted and an SiO₂ masking layer is deposited over active layer 15' followed by photolithography and etching for gate electrode 19'. A rectifying gate electrode is formed by known techniques and the SiO₂ mask is etched away in buffered HF. Subsequently the dielectric substrate is photolithographed and etched to form channels in alignment with the contact areas of the S and D electrodes and connections are made to these electrodes as, for example, by ultrasonically welding fine wires thereto.

As shown in FIG. 6, an FET similar to that shown in FIG. 3 can be formed by first growing AlGaAs on a GaAs substrate and then epitaxially growing n-GaAs active layer 15'' approximately 0.2 - 1 micron thick on the surface of the AlGaAs. Then an SiO₂ masking layer is formed over the surface of active layer 15'' and photolithography and etching are carried out to form a mask for source and drain electrodes 17'' and 21'' respectively. These electrodes are then formed by epitaxially growing n+ GaAs followed by etching in buffered HF to remove the SiO₂ mask.

A small contact area of the surface of drain electrode 21'' is metallized and, typically the entire surface of S electrode 17'' is metallized. A masking layer of SiO₂ is formed over the surface of the wafer, and photolithography and etching are carried out, leaving SiO₂ covering only the metallized portions of source electrode 17'' and drain electrode 21''. Chromium- or oxygen-doped GaAs layer 12' is epitaxially grown over the surface of the wafer except in those areas covered by the SiO₂ masking.

The SiO₂ mask is removed and a conductive contact is metallized from the surfce of source electrode 17'' to the surface of insulating GaAs layer 12'. A dielectric substrate which might be a borosilicate glass is bonded to the surface of layer 12' and, by photolithography and etching, a hole in registry with source electrodes 17'' is formed. By further metallizing the conductive contact is extended to the surface of the dielectric substrate.

As in FIG. 5 the GaAs substrate and the AlGaAs layer are successively etched with suitable masking to protect the edges of the wafer. The wafer has been inverted and, by SiO₂ masking followed by photolithography and etching, a window for gate electrode 19'' is formed in desired alignment with source electrode 17''. Gate electrode 19'' is formed as a rectifying contact in the window in the SiO₂ masking layer. The masking layer is then removed by etching in buffered HF, and photolithography and etching are carried out to produce a channel through dielectric substrate 13'' in alignment with the contact area of drain electrode 21''. Subsequently ohmic connection is established to drain electrode 21'' by, for example, ultrasonically welding a fine wire lead thereto.

In FIG. 7 is shown a method for fabricating the device of FIG. 4. Starting with an n+ gallium arsenide substrate (13''' in FIG. 4) an SiO₂ masking layer is deposited and photolithography and etching in buffered HF are used to form windows for relatively insulative surface portions 25. Then substrate 13''' is etched using an NH₄OH - H₂O₂ etchant to a depth of 5-10 microns, for example. Chromium- or oxygen-doped GaAs is then grown in the windows of the n+ GaAs substrate 13''' forming insulating surface portions 25. The SiO₂ masking layer is etched away and epitaxial n GaAs active layer 15''' is formed to a depth of for example, 0.2 - 1 micron over the surface of subtrate 13'''. An SiO₂ masking layer is formed over active layer 15''' and photolithography and etching are carried out to produce windows for gate electrodes 19''' and drain electrodes 21'''. Finally ohmic drain electrodes 21''' and rectifying (Schottky-type barrier) gate electrodes 19''' are formed. The SiO₂ masking layer is then etched away in buffered HF, and the device 11''' is ready for incorporation into a finished product.

It is to be noted, in accordance with the present invention, that insulative surface portions 25 need not be formed by etching recesses in the surface of n+ GaAs substrate 13''' and subsequently epitaxially growing chromium- or oxygen-doped GaAs in these recesses. It is equally possible to use other treatments such as, for example, high energy proton bombardment to render surface portions 25 non-conducting. Accordingly it may or may not be necessary depending upon the particular technique chosen to utilize an SiO₂ masking layer and to etch recesses for the deposition of insulative surface portions 25.

As can readily be appreciated fabrication of the device of FIG. 4 as detailed in FIG. 7 is considerbly simpler than fabrication of either of the devices of FIG. 2 or FIG. 3 (FIGS. 5 and 6, respectively). Moreover the device of FIG. 4 has certain inherent advantages in operation. The common lead inductance ordinarily produced by bonding source electrode to ground plane is nonexistent since the source is the substrate itself which can be directly bonded to a ground plane. Thermal resistance can be small by the use of a thin n+ substrate. An additional advantage is that the active layer 15''' is grown directly onto a GaAs substrate instead of onto an intermediate layer of AlGaAs resulting in optimum lattice matching, mobility and mechanical support. Contact resistance between source electrodes and the active layer 15''' is drastically reduced because of the N+ to N semiconductor contact between substrate 13''' and active layer 15''', requiring no metal-to-n-type ohmic contact.

Since many changes could be made in the inventive embodiments described without departing from the true scope of the invention it is intended that that scope be interpreted only from the following claims.

I claim:

1. A field-effect transistor comprising: an active layer of semiconductive material; a second layer comprising a substrate having a surface thereof in contact with a first face of said active layer, said second layer surface having a conductive surface portion and a insulative surface portion; said conductive surface portion comprising a source electrode; a pair of gate electrodes positioned on the other face of said active layer opposite said insulative surface portion of said second layer, and a drain electrode positioned between said gate electrodes on said other face of said active layer.

2. The transistor according to claim 1, wherein said second layer has a plurality of conductive surface portions alternating with and separated by a plurality of insulative surface portions, each of said surface portions being in contact with said active layer, and wherein two gate electrodes and a drain electrode are positioned on said active layer opposite each of said insulative portions of said second layer.

3. The transistor according to claim 1 wherein said second layer is formed of a uniformly conductive material having on the surface thereof which includes said conductive surface portion, a region of insulative material extending from said face into said layer a distance less than the thickness of said second layer, the surface of said region forming said insulative surface portion.

4. The transistor according to claim 3 wherein said region is formed by bombarding said surface of said uniformly conductive material with high energy protons to locally transform said uniformly conductive material into insulative material.

5. The transistor according to claim 3 wherein said region is formed by forming a recess in said surface of said uniformly conductive material and filling said recess with insulative material.

6. The transistor according to claim 5 wherein said insulative material comprises epitaxially grown Cr-doped GaAs.

* * * * *